US007619248B1

(12) United States Patent
Cleeves (10) Patent No.: US 7,619,248 B1
(45) Date of Patent: Nov. 17, 2009

(54) MOS TRANSISTOR WITH SELF-ALIGNED SOURCE AND DRAIN, AND METHOD FOR MAKING THE SAME

(75) Inventor: James Montague Cleeves, Redwood City, CA (US)

(73) Assignee: Kovio, Inc., Milpitas, CA (US)

( * ) Notice: Subject to any disclaimer, the term of this patent is extended or adjusted under 35 U.S.C. 154(b) by 0 days.

(21) Appl. No.: 11/084,448

(22) Filed: Mar. 18, 2005

Related U.S. Application Data (60) Provisional application No. 60/663,296, filed on Mar. 18, 2005.

(51) Int. Cl.
*H01L 31/00* (2006.01)
(52) U.S. Cl. .................... 257/57; 257/E29.289
(58) Field of Classification Search ............ 257/57, 257/E29.289
See application file for complete search history.

(56) References Cited

U.S. PATENT DOCUMENTS

| 5,612,235 | A | 3/1997 | Wu et al. |
| 5,658,808 | A | 8/1997 | Lin |
| 5,821,137 | A | 10/1998 | Wakai et al. |
| 5,989,944 | A | 11/1999 | Yoon |
| 6,245,602 | B1 | 6/2001 | Ho et al. |
| 6,274,412 | B1 | 8/2001 | Kydd et al. |
| 6,278,131 | B1 * | 8/2001 | Yamazaki et al. ............. 257/59 |
| 6,294,401 | B1 | 9/2001 | Jacobson et al. |
| 6,316,357 | B1 | 11/2001 | Lin et al. |
| 6,323,069 | B1 | 11/2001 | Yamazaki et al. |
| 6,348,295 | B1 | 2/2002 | Griffith et al. |
| 6,379,745 | B1 | 4/2002 | Kydd et al. |
| 6,511,870 | B2 | 1/2003 | Chen et al. |
| 6,518,087 | B1 | 2/2003 | Furusawa et al. |
| 6,593,591 | B2 | 7/2003 | Yudasaka et al. |
| 6,660,598 | B2 * | 12/2003 | Hanafi et al. ............. 438/291 |
| 6,664,027 | B2 | 12/2003 | Griffith et al. |
| 6,767,775 | B1 | 7/2004 | Yudasaka et al. |

(Continued)

OTHER PUBLICATIONS

Zhibin Xiong et al.; A Novel Self-Aligned Offset-Gated Polysilicon TFT Using High-K Dielectric Spacers; IEEE Electron Device Letters, vol. 25, No. 4, Apr. 2004; pp. 194-195.

(Continued)

*Primary Examiner*—Bradley K Smith
*Assistant Examiner*—Amar Movva
(74) *Attorney, Agent, or Firm*—The Law Offices of Andrew D. Fortney; Andrew D. Fortney; Sharon E. Brown Turner (57) ABSTRACT

A MOS transistor with self-aligned source/drain terminals, and methods for its manufacture. The transistor generally includes an electrically functional substrate, a dielectric film on portions of the substrate, a gate on the dielectric film, and polycrystalline source and drain terminals self-aligned with the gate. The method generally includes forming an amorphous semiconductor material on a gate and on exposed portions of an electrically functional substrate, irradiating an upper surface of the amorphous semiconductor material to form self-aligned polycrystalline semiconducting source/drain terminal layers, and (optionally) selectively removing the non-irradiated amorphous semiconductor material portions. The present invention advantageously provides MOS thin film transistors having reliable electrical characteristics quickly, efficiently, and/or at a low cost by eliminating one or more conventional photolithographic steps.

23 Claims, 4 Drawing Sheets

U.S. PATENT DOCUMENTS

| | | | |
|---|---|---|---|
| 6,864,133 | B2 | 3/2005 | Aoki et al. |
| 2002/0053671 | A1* | 5/2002 | Koyama .................... 257/66 |
| 2003/0042559 | A1* | 3/2003 | Takemura et al. .......... 257/408 |
| 2004/0053431 | A1 | 3/2004 | Chang et al. |
| 2004/0248429 | A1 | 12/2004 | Aoki et al. |
| 2005/0176183 | A1 | 8/2005 | Aoki et al. |
| 2005/0181566 | A1 | 8/2005 | Machida et al. |

OTHER PUBLICATIONS

J. H. Lee et al.; The Improvement of Reliability in the Poly-Si TFTs Employing Laser Irradiation on Gate Oxide; AM-LCD '03, pp. 169 et seq. (TFTp3-3).

Hongmei Wang et al.; High Frequency Performance of Large-Grain Polysilicon-on-Insulator MOSFETs; IEEE Transactions on Electron Devices, vol. 48, No. 7, Jul. 2001; pp. 1480-2.

* cited by examiner

MOS TRANSISTOR WITH SELF-ALIGNED SOURCE AND DRAIN, AND METHOD FOR MAKING THE SAME

RELATED APPLICATIONS

This application may be related to U.S. Provisional Application No. 60/663,296, filed Mar. 18, 2005, entitled "MOS Transistor with Metal Gate, and Method for Making the Same," which (to the extent possible) is incorporated herein by reference in its entirety.

FIELD OF THE INVENTION

The present invention generally relates to the field of metal-oxide-semiconductor (MOS) transistors and methods of making the same. More specifically, embodiments of the present invention pertain to MOS thin film transistor structures having self-aligned source/drain terminals and methods for their manufacturing and/or production using a liquid silane precursor and/or printing techniques.

DISCUSSION OF THE BACKGROUND

The feasibility of building a GHz thin film transistor (TFT), as well as technology to measure the characteristics of such TFTs, is known in the art (see, e.g., Wang et al., Hong Kong University of Science and Technology). Metal induced lateral crystallization, combined with conventional high temperature processing, can deliver both P- and N-type transistors capable of operating at >2.4 GHz. However, this combination of known process technologies is not compatible with low cost electronics, both for overall cost considerations and for low-cost process temperature limitations.

A need still exists for low-cost or cost-effective process technology for making such TFTs. The present invention concerns an electronic device (and in particular, a MOS transistor structure) and a process for making the same, utilizing liquid silane and/or printing technology, designed to meet such needs for GHz TFTs.

SUMMARY OF THE INVENTION

Embodiments of the present invention relate to an electronic device, such as a MOS transistor, having self-aligned source/drain terminals, and a method of making the same. The MOS transistor generally comprises (a) an electrically functional substrate (e.g., an electrically functional thin film on an inactive substrate); (b) a dielectric film on portions of the electrically functional substrate, (c) a gate metal layer on the dielectric film; and (d) source and drain terminals comprising a (heavily) doped semiconductor layer, having a border closest to the gate metal layer substantially aligned with a border of the gate metal layer (so-called "self-aligned" source/drain terminals). In one embodiment, the dopant in the doped semiconductor layer is substantially uniformly distributed throughout substantially the entire thickness of the doped semiconductor layer. The method generally comprises the steps of (1) forming an amorphous semiconductor material on a gate and on exposed portions of an electrically functional substrate; and (2) irradiating an upper surface of the amorphous semiconductor material to form polycrystalline, self-aligned semiconducting source/drain terminals and remaining amorphous semiconductor material portions, the remaining amorphous semiconductor material portions generally being electrically insulative. In a further embodiment, the method further comprises (3) selectively removing the remaining amorphous semiconductor material precursor portions from at least a gate sidewall to form the self-aligned source and drain terminals.

The present invention advantageously provides a low cost method for making MOS thin film transistors (MOS TFTs) having reliable, commercially acceptable electrical characteristics (e.g., on/off speeds, on/off ratios, carrier mobilities, threshold voltages [$V_t$'s], etc.). Printed and/or radiation-defined (e.g., laser-written, as opposed to photolithographically produced) semiconductor structures and (optionally) conductor structures provide results similar to those produced by more conventional semiconductor processing at a much lower cost and at a much higher throughput (on the order of hours to days, as opposed to weeks to months using conventional MOS semiconductor process technology). These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(cyclo)silane" refers to compounds or mixtures of compounds that consist essentially of (1) silicon and/or germanium and (2) hydrogen, and that may contain one or more cyclic rings. The term "hetero(cyclo)silane" refers to compounds or mixtures of compounds that consist essentially of (1) silicon and/or germanium, (2) hydrogen, and (3) dopant atoms such as B, P, As or Sb that may be substituted by a conventional hydrocarbon, silane or germane substituent and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes [generally the length and width]).

The present invention concerns a method of making a MOS transistor, generally comprising the steps of (1) depositing a semiconductor material precursor on a gate and exposed portions of an electrically functional substrate; (2) irradiating an upper surface of the semiconductor material precursor to form (i) electrically active, semiconducting source/drain terminals self-aligned to the gate and (ii) electrically inactive, remaining semiconductor material precursor portions; and, optionally, (3) selectively removing the remaining semiconductor material precursor portions from a gate sidewall to form and/or physically isolate the self-aligned source and drain terminals.

In a further aspect, the present invention concerns an electrical device, comprising (a) an electrically functional substrate, (b) a dielectric film on a portion thereof, (c) a gate on the dielectric film, and (d) source/drain terminals comprising a doped semiconductor layer on the electrically functional substrate, the doped semiconductor layer being self-aligned to the gate. Generally, the gate comprises a gate metal layer, and a border of each source/drain terminal closest to the gate is substantially aligned with the nearest border of the gate metal layer.

The invention, in its various aspects, will be explained in greater detail below with regard to exemplary embodiments.

An Exemplary Method for Making a MOS Transistor

In one aspect, the present invention concerns a method for making a MOS transistor (preferably a MOS TFT), comprising the steps of (1) forming an amorphous semiconductor material on a gate and exposed portions of an electrically functional (thin film) substrate; (2) irradiating an upper surface of the amorphous semiconductor material to form polycrystalline, self-aligned semiconducting source/drain terminals and remaining amorphous semiconductor material portions; and, optionally, (3) selectively removing the remaining amorphous semiconductor material portions from a gate sidewall to physically and/or electrically isolate the self-aligned source and drain terminals from the gate. In a preferred embodiment, the method further comprises depositing a liquid-phase semiconductor (e.g., Group IVA element) precursor on the substrate, then curing and (optionally) annealing the liquid-phase semiconductor precursor to form the amorphous semiconductor material. In one implementation the liquid-phase semiconductor precursor depositing step comprises printing a semiconductor precursor ink on a substrate suitable for TFTs. Printing a liquid-phase ink, as opposed to blanket deposition, photolithography and etching, saves on (i) the number of processing steps, (ii) the length of time for the manufacturing process, and/or (iii) the cost of manufacturing a circuit, chip, display element, photosensitive element or other apparatus having the present MOS transistor thereon. Thus, the present method provides a cost-effective method for manufacturing fast, reliable electronic devices, such as MOS transistors.

TFTs capable of operating at GHz frequencies may require (1) narrow channel widths, (2) source and drain terminals that are self-aligned to the gate, and (3) excellent carrier mobility. A laser (e.g., a conventional computer to plate [CTP] printing tool used in modern offset printing, which may comprise a sheet of Al that has photoresist patterned on it to form ink wells that are subsequently pressed against paper or another substrate to print the ink on the substrate) can be used to write relatively narrow transistor gates on the order of 5 microns wide, with widths below 2 microns being obtainable using resist masking and wet undercut etching. Self aligned source and drain terminals may be produced using a combination of "liquid silicon" ink formulations and Excimer laser exposure of active areas. Improved carrier mobility may be provided by metal induced crystallization and/or the energy from the Excimer laser. One advantage from using an Excimer laser is that it can generate very high temperatures in very confined locations, a capability that is very useful for activating semiconductor dopants in patterned films without significant adverse thermal effects elsewhere in the circuit, chip, element or apparatus.

An exemplary process flow for making a thin film transistor in accordance with the present invention includes the following steps:

Deposit lightly doped silane (Optional) Deposit metal seed layer

Crystallize lightly doped silane (e.g., by Excimer laser treatment, or by conventional furnace treatment)

Deposit gate oxide

Write gate metal

Etch gate oxide using gate as a mask

Deposit thin, heavily doped silane

Activate dopant in doped silane (e.g., by Excimer laser treatment)

Figure 4:
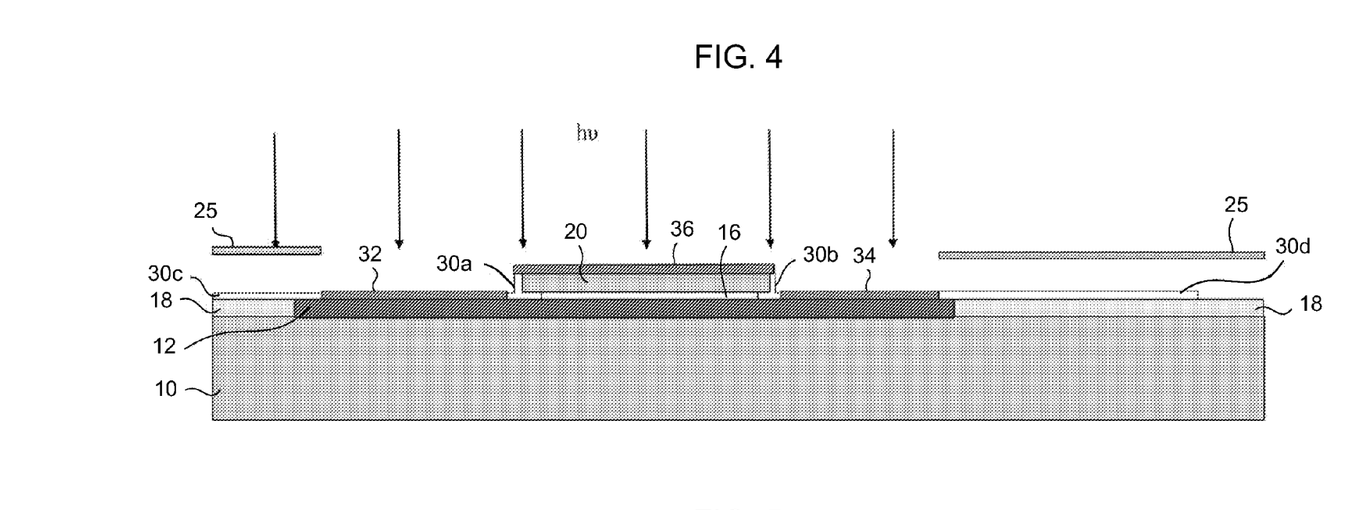

Wet etch non-irradiated (untreated) doped silane from gate sidewall (see, e.g., FIG. 4)

Write dielectric if metal crossovers (e.g., second level metal) are needed (optional)

Write source and drain metal

Deposit passivation (e.g., cap oxide)

Conventional annealing

Conventional testing (optional)

The present process can be integrated to form both P type and N type transistors, generally by using silane compositions containing different dopant types in one or more of the doped silane depositing steps above. For example, different inks containing different dopant types can be printed in different areas of the substrate. A first exemplary method for manufacturing the present MOS transistor is described below with reference to FIGS. 1-5.

Forming the Gate Metal Layer

Figure 1:
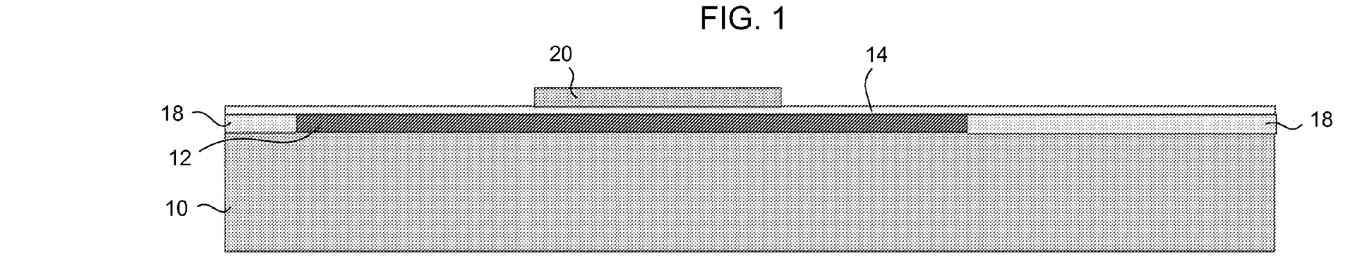
FIGS. 1-5 show cross-sectional views of a MOS device at various stages of an exemplary embodiment of the present method, FIG. 5 showing a cross-sectional view of a substantially complete MOS TFT device.

Referring now to FIG. 1, which shows a cross-sectional view of a MOS TFT device precursor, the method may comprise the step of forming a gate metal layer 20 on a gate dielectric layer 14. In turn, gate dielectric layer 14 is on lightly doped (electrically active) polysilicon layer 12, which is coated or otherwise formed on substrate 10 and which may be bordered by (electrically) inactive silicon-containing regions 18. In various embodiments, gate metal layer 20 may be formed by (i) blanket depositing a metal onto dielectric layer 14, then performing conventional photolithography on the metal or "laser patterning" the metal gate; or (ii) printing a conductor ink comprising a metal precursor onto dielectric layer 14, then drying, curing and/or annealing the ink.

In one embodiment, blanket deposition may comprise, e.g., evaporation, physical vapor deposition, sputtering, or chemical vapor deposition, as is known in the art. Alternatively, blanket deposition may comprise spin-coating a nanoparticle ink comprising metal nanoparticles (which may be passivated) and a solvent, and curing the nanoparticle ink (see, e.g., U.S. patent application Ser. No. 10/215,952, filed Aug. 9, 2002, entitled "Nanoparticle Synthesis and the Formation of Inks Therefrom," the relevant portions of which are incorporated herein by reference). Metals that may be deposited by such methods include elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, aluminum-titanium alloys, etc.; and electrically conductive metal compounds, such as the nitrides and silicides of elemental metals (e.g., titanium nitride, titanium silicide, tantalum nitride, cobalt silicide, molybdenum silicide, tungsten silicide, platinum silicide, etc.). Photolithography may comprise the substeps of depositing a photoresist material on the blanket deposited layer (in this case, a metal layer), selectively irradiating portions of the photoresist material by passing light having a predetermined wavelength or wavelength band through a mask, developing the selectively irradiated photoresist material with a developer to leave a pattern corresponding to the structure being formed (in this case, gate metal 20), removing those portions of the blanket deposited material not corresponding to the desired pattern (typically by dry or wet etching), and removing the remaining photoresist material.

In one alternative, the gate metal layer may be defined by "laser patterning." In the case of laser gate metal patterning, the metal may be blanket-deposited as described above, then a resist may be advantageously used to mask the gate metal. Irradiation of the resist with a relatively narrow laser beam (e.g., 2-5 μm wide, or by passing light through a mask configured to define structures of such width, preferably comprising infrared [IR] light) from a laser heats the resist and changes its solubility characteristics in a conventional developer that is used to remove the irradiated (e.g., written) or non-irradiated (e.g., unwritten) portions of the resist, depending on whether the resist is positive or negative. The resist may also comprise a conventional thermal resist or a conventional (photo)resist material having an infrared (IR) light-absorbing dye therein. After development, unwritten metal (or metal precursor) precursor material may be removed by dry etching or wet etching. Wet etching may also advantageously undercut the resist to provide an even narrower gate and/or transistor channel width than would be possible using dry etching.

In a further alternative, the gate metal layer may be defined by "laser direct writing." In the case of laser direct writing gate metal, a metal nanoparticle ink may be blanket-deposited as described above (but not cured), then irradiated (written) with a laser (e.g., by transmitting a light beam about 2-10 μm wide, or by passing light through a mask configured to define structures of such width, the light having an IR, visible or UV wavelength or bandwidth that is absorbed by the metal nanoparticles or other materials in the ink). The light heats (and subsequently cures, cross-links or fuses) the nanoparticles, and the non-irradiated (unwritten) portions of the deposited ink can be removed in a developer (generally comprising a solvent similar or identical to the solvent used in the nanoparticle ink). Laser direct writing of gate metal (e.g., as disclosed in U.S. patent application Ser. No. 10/722,255, filed on Nov. 24, 2003, the relevant portions of which are incorporated herein by reference) is generally preferred, for cost and manufacturing throughput considerations.

In a second embodiment, a conductor ink may be printed onto dielectric layer 14 by essentially any conventional printing technology. For example, printing may comprise inkjetting, gravure printing, offset printing, flexography (flexoprinting), spray-coating, slit coating, extrusion coating, meniscus coating, microspotting, pen-coating, and/or laser forward transferring the conductor in a predefined pattern onto dielectric layer 14. The ink may comprise or consist essentially of the metal precursor and a solvent. The metal precursors that are generally compatible with printing (or plating onto a printed conductor or semiconductor precursor) may comprise nanoparticles or nanocrystals of a metal such as titanium, copper, silver, chromium, molybdenum, tungsten, cobalt, nickel, gold, palladium, platinum, zinc, iron, etc., or metal alloys thereof, preferably silver or gold (or a metal alloy thereof). Such nanoparticles or nanocrystals may be conventionally passivated (e.g., with one or more surfactants) or unpassivated. Alternatively, the ink may comprise or consist essentially of a conventional paste comprising a powder of one or more such metals or alloys thereof in a conventional binder.

Drying the conductor ink is largely conventional and/or otherwise known. For example, metal precursor inks may be dried by heating the substrate 10 containing the printed conductor ink thereon at a temperature and for a length of time effective to remove the solvent or binder. Suitable temperatures for removing solvents from a printed ink may range from about 80° C. to about 150° C., or any range of temperatures therein (e.g., from about 100° C. to about 120° C.). Suitable lengths of time for removing solvents from a printed ink at such temperatures may ranges from about 10 seconds to about 10 minutes, or any range of times therein (e.g., from about 30 seconds to about 5 minutes, or about 1 minute to 3 minutes, etc.). Such heating may take place on a conventional hotplate or in a conventional furnace or oven, optionally in an inert atmosphere. Suitable inert atmospheres may include one or more oxygen-free inert gases, such as nitrogen and the noble gases (e.g., He, Ne, Ar, Kr, and/or Xe).

Similarly, curing and/or annealing the dried conductor ink are largely conventional, and may be performed in one or more steps. Curing and/or annealing may comprise, for example, heating the substrate 10 containing the dried, printed conductor ink thereon at a temperature and for a length of time effective to provide gate metal 20 with electrically conductive properties. Suitable temperatures for curing and/or annealing may range from about 100° C. to about 300° C., or any range of temperatures therein (e.g., from about 120° C. to about 275° C., from about 150° C. to about 250° C., etc.). Suitable lengths of time for curing and/or annealing at such temperatures may range from about 1 minute to about 60 minutes, or any range of times therein (e.g., from about 5 to about 45 minutes, from about 10 to about 30 minutes, etc.). Such heating may take place in a conventional furnace or oven, in air (to aid in removing organic by-products) or in an inert or reducing atmosphere. Alternatively, curing and/or annealing in air may be followed by a similar annealing step in a reducing atmosphere to remove or reduce any oxides that may have formed (e.g., in the case where the conductor comprises Cu). Suitable inert atmospheres are described in the preceding paragraph. Reducing atmospheres generally comprise a reducing gas (such as hydrogen, methane, ammonia, phosphine, silane, germane, or a mixture thereof) or a mixture of such a reducing gas with an inert gas.

The dried, printed conductor ink may be cured and annealed in separate steps. For example, curing may comprise heating at a first temperature for a first length of time, and annealing may comprise heating at a second temperature (generally higher than the first temperature) for a second length of time. In one embodiment, the first temperature and first length of time are sufficient to remove substantially all solvent, ligand(s) and/or binder from the conductor ink and/or metal precursor, and the second temperature and second length of time are sufficient to change a morphology and/or improve an electrical conductivity of the metal gate. While the first temperature and first length of time are generally as described in the above paragraph (although the length of time may be in a shorter range, e.g., up to 4, 6 or 8 hours), the second temperature is generally from 50 to 400° C. higher than the first temperature, and the second length of time is generally from about 1 hour to about 16 hours, or any range of times therein (e.g., from 2 to 12 hours or from 4 to 8 hours).

Forming the Underlying, Electrically Functional Layer

The present method may further comprise the steps of forming dielectric layer 14 and/or forming electrically functional (preferably, semiconductor) layer 12. In one embodiment, semiconductor layer 12 may be formed by the same techniques as the first embodiment for forming gate metal 20, but using conventional semiconductor (or semiconductor precursor) materials for blanket deposition. As is known in the art, conventional blanket deposition may comprise chemical vapor deposition (CVD), low pressure CVD, sputtering or other physical vapor deposition (PVD) technique, spin coating, spray coating, etc. Preferably, such blanket deposition comprises CVD of a silane (e.g., $SiH_4$) and/or germane (e.g., $GeH_4$). The blanket-deposited semiconductor layer 12 may be lightly doped, e.g., by conventional ion implantation (and optionally, subsequent annealing). Active transistor regions (e.g., an area of semiconductor layer 12 that is substantially defined by the outermost borders of the overlying source, drain and gate 32, 34 and 36; see, e.g., FIG. 6) may be defined thereafter by conventional photolithography and etching.

Alternatively, semiconductor layer 12 may be formed by printing or coating the substrate 10 with a doped semiconductor ink while simultaneously irradiating the ink/substrate. In one implementation, the process comprises spin-coating the ink containing a semiconductor precursor onto substrate 10, while irradiating the ink with ultraviolet light during a substantial part of the spin-coating step. This technique (which, in the latter implementation, is sometimes known as "UV spin-coating") is described in greater detail in copending U.S. patent application Ser. No. 10/789,274, filed on Feb. 27, 2004, the relevant portions of which are incorporated herein by reference. In another implementation, printing (generally with simultaneous or immediately subsequent UV irradiation) comprises inkjetting or gravure, flexographic, screen or offset printing a doped semiconductor ink in locations on the substrate corresponding to active transistor regions (or other deposition technique for depositing material in selected areas of the substrate 10). In either case, semiconductor layer 12 generally has an amorphous morphology following deposition with substantially simultaneous irradiation, and before further processing, it is generally crystallized (e.g., by heating, or more preferably, by laser irradiation; see, e.g., U.S. patent application Ser. Nos. 10/950,373 and 10/949,013, each of which was filed on Sep. 24, 2004, the relevant portions of which are incorporated herein by reference). Thus, in one case, the printed region (generally including laser-irradiated, at least partially polycrystalline region 12 and, to the extent present, non-irradiated region[s] 18) is not necessarily co-extensive with the (partially) polycrystalline region 12. Generally, the printed regions are larger than the irradiated regions that form polycrystalline (and, preferably, electrically active) thin film 12; thus, there may be some amorphous (and/or electrically inactive) film regions 18 adjacent to thin film 12.

In a preferred embodiment, semiconductor layer 12 comprises lightly doped silicon (e.g., silicon having a dopant concentration of from about $10^{16}$ to about $5 \times 10^{18}$ atoms/$cm^3$). Compositions (e.g., ink formulations) providing a lightly doped silicon layer 12 using the "UV spin-coating" or "UV inkjetting" process are described in greater detail in copending U.S. patent application Ser. Nos. 10/950,373 and 10/949,013, each of which was filed on Sep. 24, 2004, the relevant portions of which are incorporated herein by reference.

Dielectric layer 14 may be formed by conventional deposition (e.g., blanket deposition as described above) of a conventional or high dielectric constant dielectric material (e.g., silicon dioxide, silicon nitride, a silicon oxynitride, a borosilicate glass [BSG], a phosphosilicate glass [PSG], a borophosphosilicate glass [BPSG], a fluorosilicate glass [FSG], aluminum oxide, titanium oxide, tantalum oxide etc.), or by conventional thermal wet or dry growth of an oxide of the element(s) in semiconductor layer 12/18 (e.g., thermal silicon dioxide). Alternatively, blanket deposition of dielectric layer 14 may comprise coating the semiconductor layer 12/18 with a liquid-phase ink composition comprising a chemical dielectric material precursor and/or particles of dielectric material. For example, an ink containing a dielectric material or dielectric precursor (a "dielectric ink") may be spin coated, inkjetted, gravure-printed, offset-printed, flexo-printed, dip-coated, spray-coated, slit coated, extrusion coated, or meniscus coated onto the semiconductor layer 12/18. Alternatively, the dielectric ink may be printed or laser written in a pattern corresponding to the transistor active regions onto semiconductor layer 12. Printable and/or UV-writable dielectric inks are also disclosed in copending U.S. application Ser. No. 10/749,876, filed Dec. 31, 2003, the relevant portions of which are incorporated herein by reference.

Etching the Gate Dielectric Layer

In a further aspect of the invention, the present method may comprise etching exposed portions of the gate dielectric layer 14 (i.e., that are not covered by gate metal 20). Such etching may comprise conventional wet or dry etching, using an etchant or etchant mixture that selectively etches the gate dielectric layer 14 relative to gate metal 20 and semiconductor layer 12. Wet and dry etchants and etchant mixtures (and conditions for such selective etching, whether wet or dry) that selectively etch dielectrics such as silicon dioxide, PSG, BPSG, and aluminum oxide relative to commonly used metals (such as aluminum, titanium, molybdenum, tungsten, silver, gold, platinum, palladium, nickel, cobalt, etc.) and known semiconductor materials (such as silicon and silicon-germanium) are well known and/or can be determined from known etchants using routine experimentation.

Figure 2:
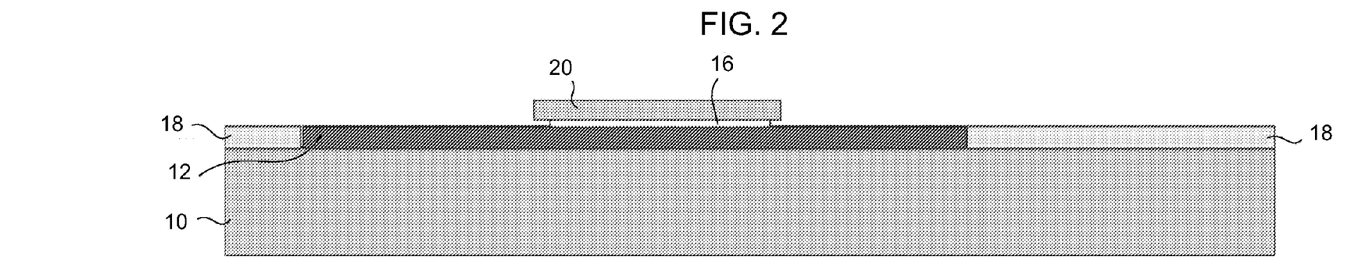

Exposed portions of the gate dielectric layer 14 and portions of gate dielectric layer 14 under the periphery of gate metal 20 (a so-called "undercut" region) may be removed by conventional wet etching to form gate dielectric 16, as shown in FIG. 2. For example, when the gate dielectric layer 14 consists essentially of silicon dioxide (i.e., $SiO_2$ that may be doped with up to 2-4 at. % of conventional boron, phosphorous and/or fluorine dopant atoms, relative to silicon atoms), semiconductor layer 12 consists essentially of $n^-$-doped silicon, and gate metal 20 may consist essentially of silver or gold, the wet etchant comprises or consists essentially of conventional ammonia-buffered aqueous HF (e.g., aqueous $NH_4F$), as is known in the art.

Forming the (Heavily) Doped Semiconductor Layer

Figure 3:
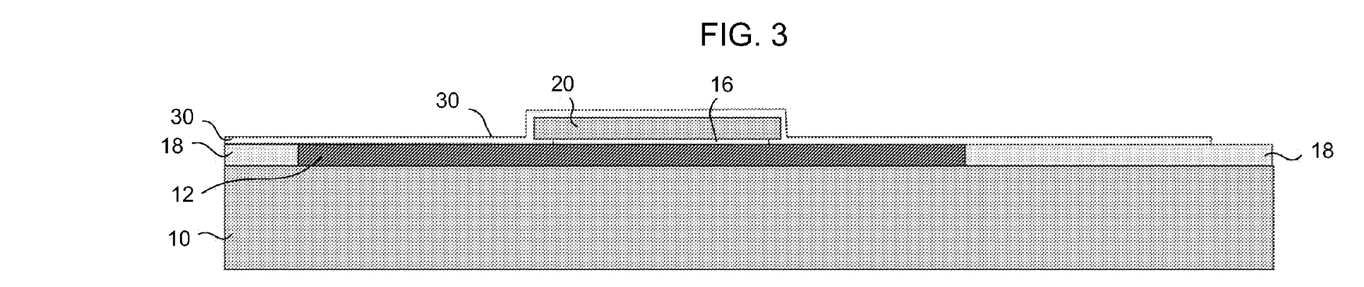

The steps in the present method that form the (heavily doped) source and drain semiconductor layers (and, when present, the gate semiconductor layer) represent one distinguishing feature of the present method. As shown in FIG. 3, a semiconductor precursor layer 30 is deposited onto gate metal 20 and exposed portions of semiconductor layer 12, preferably by printing or coating, with at least partly and/or substantially simultaneous (UV) irradiation, as described in copending U.S. application Ser. No. 10/789,274, filed on Feb. 27, 2004, the relevant portions of which are incorporated herein by reference.

The semiconductor precursor layer 30 preferably comprises a doped semiconductor ink formulation as disclosed in copending U.S. patent application Ser. Nos. 10/950,373, 10/949,013 and 10/956,714, respectively filed on Sep. 24, 2004, Sep. 24, 2004 and Oct. 1, 2004 and respectively entitled "Heterocyclic Semiconductor Precursor Compounds, Compositions Containing the Same, and Methods of Making Such Compounds and Compositions," "Methods of Forming a Doped Semiconductor Thin Film, Doped Semiconductor Thin Film Structures, Doped Silane Compositions, and Methods of Making Such Compositions," and "Dopant Group-Substituted Semiconductor Precursor Compounds, Compositions Containing the Same, and Methods of Making Such Compounds and Compositions," the relevant portions of which are incorporated herein by reference. Such formulations may comprise (1) a Group IVA atom source, (2) a dopant source, and (optionally) a solvent in which the Group IVA atom source and dopant source are soluble. The Group IVA atom source and dopant source may comprise, include, or consist essentially of a single chemical species (such as a hetero[cyclo]silane) or plural chemical species (such as a [cyclo]silane and an organophosphine, silylphosphine, organoborane or silylborane). In one implementation, the Group IVA atom source and dopant source are liquids at ambient temperatures (e.g., from about 15° C. to about 30° C.).

Representative cyclosilane compounds of the formula $(AH_2)_k$ and an exemplary method for their preparation are described in greater detail in copending application Ser. No. 10/789,317, filed Feb. 27, 2004, the relevant portions of which are incorporated herein by reference. Representative hetero(cyclo)silane compounds, exemplary methods for their preparation, and techniques for determining and/or controlling the dopant levels in the precursor inks and active films are described in greater detail in copending application Ser. Nos. 10/950,373, 10/949,013 and 10/956,714, respectively filed on Sep. 24, 2004, Sep. 24, 2004 and Oct. 1, 2004, the relevant portions of which are incorporated herein by reference.

Typically, although not necessarily always, liquid-phase semiconductor precursor inks further comprise a solvent, preferably a cycloalkane. Thus, when using a precursor ink comprising or consisting essentially of a Group IVA element source (such as a silane-based precursor to Si or doped Si), forming the semiconductor layer 30 may further comprise drying the liquid-phase precursor ink before curing. See copending U.S. application Ser. Nos. 10/616,147, 10/789,317 and 10/789,274, respectively filed Jul. 8, 2003, Feb. 27, 2004 and Feb. 27, 2004, the relevant portions of each of which are incorporated herein by reference.

After deposition, semiconductor precursor layer 30 is generally cured by heating, as described above in copending U.S. patent application Ser. No. 10/789,274, filed on Feb. 27, 2004, the relevant portions of which are incorporated herein by reference) for semiconductor layer 12. When semiconductor precursor layer 30 comprises a (cyclo)silane and/or hetero (cyclo)silane, the curing/heating step may (1) remove unwanted precursor/ink components or byproducts (such as volatile carbon-containing species) or (2) reduce the hydrogen content of the semiconductor precursor layer (which is particularly advantageous if laser crystallization is to be used after semiconductor film formation). When semiconductor precursor layer 30 comprises a hetero(cyclo)silane, the curing/heating step may also activate part of the dopant in the hetero(cyclo)silane.

Also, the semiconductor layer 30 may be deposited by local printing of the liquid semiconductor precursor ink directly onto gate metal 20 and semiconductor layer 12. This latter approach to forming MOS TFT structures may be cost effective due to (i) the efficient usage of the semiconductor precursor materials and (ii) the combination of semiconductor deposition and patterning into one inexpensive printing step.

Forming Self-Aligned Source and Drain Terminals

As shown in FIG. 4, semiconductor precursor layer 30 is irradiated, preferably with light from an Excimer laser, through a mask 25 to change the morphology of (e.g., crystallize) at least portions 32 and 34 of semiconductor precursor layer 30 that are arranged or configured to absorb the UV light. In addition, such irradiation may also activate some or all of the dopant in the irradiated portions of semiconductor precursor layer 30. Semiconductor layer portions 32 and 34 generally correspond to the source and drain regions of the TFT. Consequently, portions 32 and 34 are preferably heavily doped (e.g., they contain a dopant concentration of from about $10^{19}$ to about $10^{21}$ atoms/$cm^3$). Ink formulations providing a heavily doped semiconductor are described in greater detail in copending U.S. patent application Ser. No. 10/950,373, filed on Sep. 24, 2004, the relevant portions of which are incorporated herein by reference, and processes for forming a layer of such a heavily doped semiconductor by curing and irradiating a thin film formed from such doped ink formulations are described in greater detail in copending U.S. patent application Ser. No. 10/949,013, filed on Sep. 24, 2004, the relevant portions of which are incorporated herein by reference.

Semiconductor layer portion 36, which is shown on gate metal layer 20, generally comprises the same semiconductor material as that of semiconductor layer portions 32 and 34. However, depending on the thickness of the gate metal, semiconductor layer portion 36 may not be heated sufficiently by the laser to crystallize the semiconductor material and/or to activate some or any amount of dopant therein. As a result, semiconductor layer portion 36 may be removed in any subsequent step that selectively and/or effectively removes non-irradiated (e.g., amorphous) portions of semiconductor material 30. Alternatively or additionally, and depending somewhat on the metal in gate metal 20 and the laser crystallization conditions, silicon atoms in semiconductor layer portion 36 may react with metal atoms in gate metal 20 to form a metal silicide. In any case, to the extent that it is present, semiconductor layer portion 36 is generally not believed to be electrically functional, or at least not sufficiently electrically functional to change or affect the electrical properties of the gate metal 20.

The non-irradiated portions 30a and 30b of semiconductor precursor layer 30 (e.g., doped polysilane spacers 30a and 30b on the sidewall of gate metal 20) may be selectively removed (along with masked portions 30c and 30d of semiconductor precursor layer 30). For example, when laser irradiation crystallizes semiconductor layer portions 32 and 34, non-irradiated semiconductor precursor portions 30a and 30b may be etched selectively to gate metal 20, gate oxide 16 and the crystallized semiconductor regions 32 and 34. Masked portions 30c and 30d, along with exposed portions of amorphous semiconductor region(s) 18, may also be removed in such a selective etching step. As is known in the art, decoration wet etches have been used for many years in traditional semiconductor processing to accomplish such a result (e.g., selective removal of hydrogenated, amorphous silicon without significant removal of polycrystalline silicon). However, whether removed or retained, non-irradiated portions 30a and 30b of semiconductor precursor layer 30 (in combination with gate semiconductor layer 36) provide a useful function for automatically aligning source/drain contact layers 32 and 34 to gate metal 20, with a small offset. Typically, this offset is about the same as the thickness of the semiconductor precursor layer 30.

The (doped) semiconductor precursor may be deposited to a thickness sufficient to result in a layer about 50-200 Å thick (preferably about 70-150 Å thick, and in one example, about 100 Å thick). A balance between thickness of the deposited semiconductor precursor layer 30 and the choice of metal for gate metal layer 20 may be considered. For example, a semiconductor precursor comprising a doped silane may absorb sufficient radiation during dopant activation that the gate metal might get too hot and cause electrical failures. One may compensate for this phenomenon by either (1) making the gate out of a material that can absorb the heat from the silane without causing subsequent electrical failures (such metals being known to those skilled in the art, including tungsten, cobalt, etc.), or (2) by depositing the doped silane precursor material to a thickness sufficiently small to reduce the total amount of heat generated by absorption of the light. In this latter case, the doped silane/silicon in the source/drain regions will still absorb sufficient radiation/energy to activate dopant atoms therein, but the gate may be made out of a reflective metal (like Al), which will conduct heat away from the doped silane/silicon thereon without absorbing significant heat energy from the doped silane/silicon (or radiation that may pass through the doped silane/silicon), thereby reducing the likelihood of heat-related mechanical or electrical failures.

Forming Transistor Terminal Conductors and Passivating the Device

Figure 5:
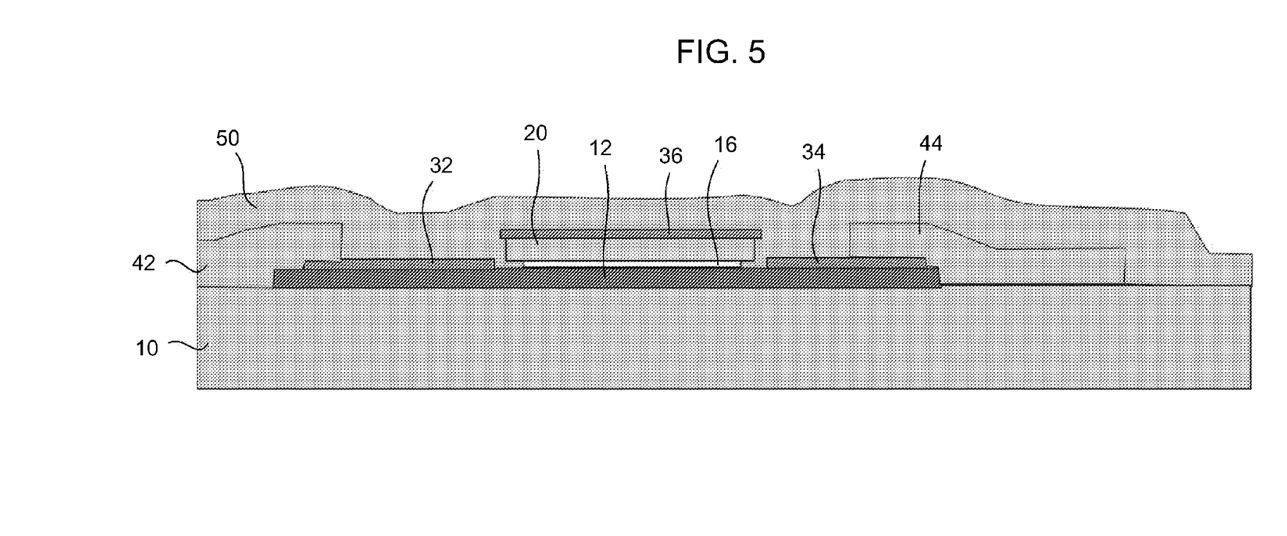

As shown in FIG. 5, after removing non-irradiated semiconductor precursor portions 30a, 30b, 30c and 30d, the present method may further comprise the step(s) of (1) forming conductors 42 and 44 to at least the source and drain terminals 32 and 34 of the TFT, and/or (2) passivating (e.g., forming a passivation layer 50 over) the conductors 42 and 44 and the gate (e.g., gate metal layer 20 and/or gate semiconductor layer 36). To the extent they are exposed, portions of source and drain terminals 32 and 34, semiconductor layer 12 and substrate 10 may also be passivated. Conductors 42 and 44 (and, optionally, a conductor 46 in contact with gate 20/36; see, e.g., FIGS. 6-7) may be formed by any of the methods described above for gate metal 20. However, due to the known chemical reactivity between (doped) semiconductors (such as silicon) and certain metals (such as aluminum, titanium, molybdenum, tungsten, cobalt, platinum, etc.), one may interpose a known barrier material (such as titanium nitride) between the conductors (e.g., 42, 44 and 46) and the doped semiconductor (e.g., source, drain and gate layers 32, 34 and 36). Alternatively, conductors 42 and 44 (and, optionally, conductor 46) may consist essentially of, or comprise a lowest layer of, a metal that does not react appreciably with the source/drain terminal films 32 and 34 (e.g., Au, Ag) or a metal-silicon compound or alloy (e.g., platinum silicide, palladium silicide, cobalt silicide, titanium silicide, molybdenum silicide, tungsten silicide, Al with about 1 at. % Si therein, etc.).

Figure 6:
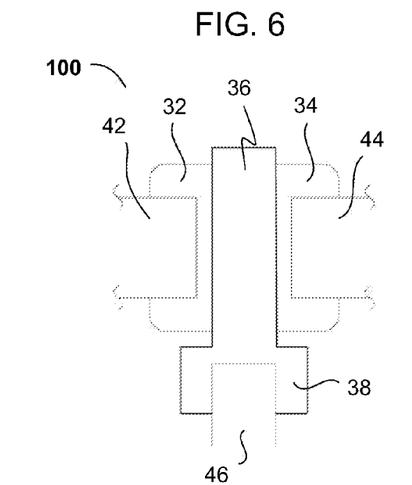
FIG. 6 shows a top-down view of the electrically active components of the MOS TFT device 100 of FIG. 5, without the topmost passivation layer.
Figure 7:
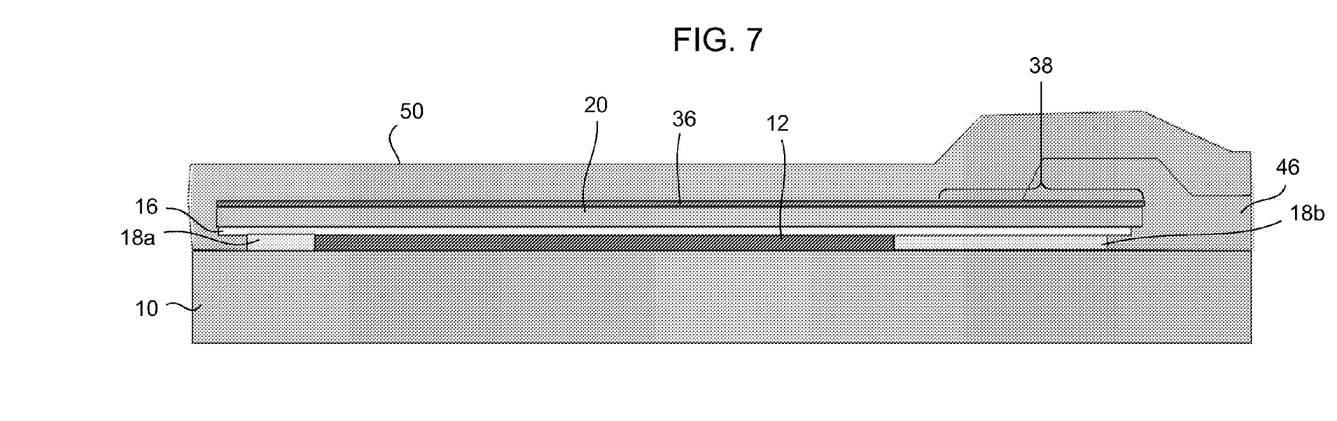
FIG. 7 shows a cross-sectional view of the MOS TFT device of FIGS. 5-6, along the long axis of the gate.

FIG. 7 shows a cross-section of the exemplary TFT of FIG. 5 along the long axis of gate 20, orthogonal to the cross-section shown in FIG. 5. The structures in FIG. 7 are essentially the same as in FIGS. 5 and 6, but certain inactive areas or portions 18a-b adjacent to electrically active thin film layer 16 may be present, and gate semiconductor layer 36 is shown (although it may not be present in many embodiments). In the exemplary TFT of FIG. 7, inactive portion 18b may insulate active area 12 from gate conductor 46, as well as provide mechanical support for gate metal 20 (which might otherwise have a step in it, which could lead to a relatively thin and/or high-stress region in gate metal 20). Inactive semiconductor thin film portions 18a and 18b are covered by gate metal layer 20 and are therefore not exposed or removed substantially by the selective etch step described above.

Figure 8:
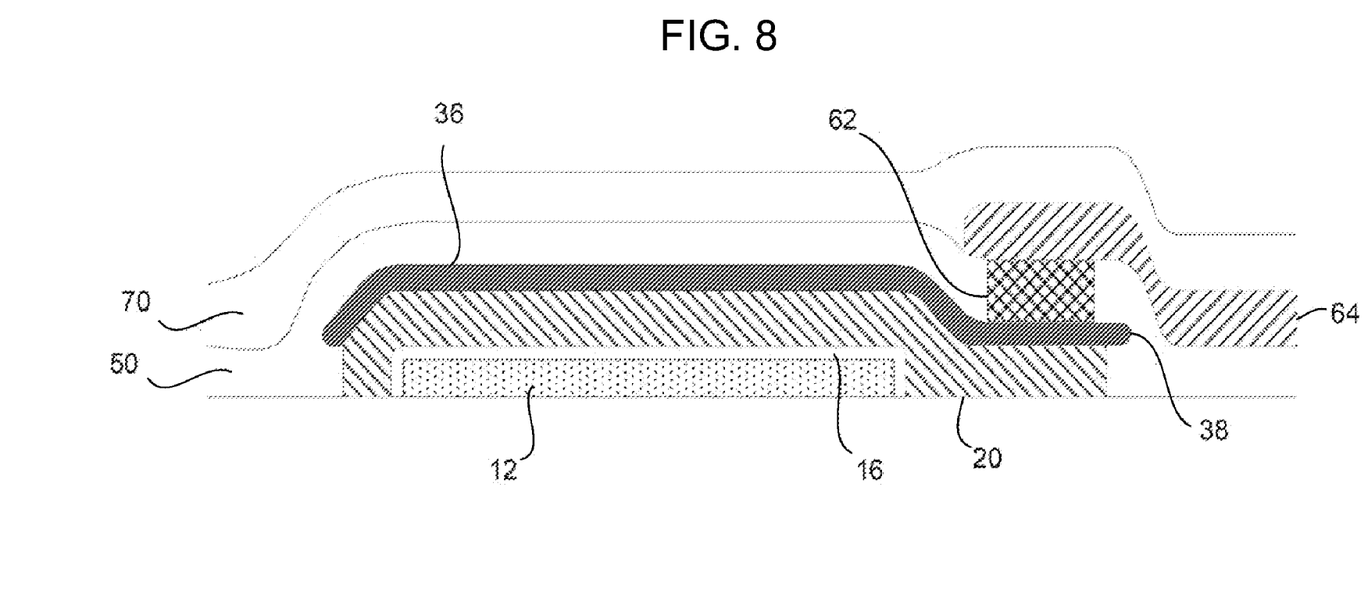
FIG. 8 shows a cross-sectional view of an alternative MOS TFT device to that of FIG. 7, along the long axis of the gate.

Alternatively, and as shown more clearly in FIG. 8, the conductor in electrical communication with gate 36/20 may comprise a contact 62 and an interconnect metal 64. Methods for forming such structures (and materials suitable for such structures) are known in the art. Contact 62 and interconnect metal 64 may be a unitary structure (i.e., they are formed as a result of the same processing steps), or they may be discrete structures (i.e., formed in different, and generally successive, processing steps). Contact 62 may be formed as a discrete structure by first forming a contact hole in dielectric layer 50 (e.g., by depositing and patterning a resist material over dielectric layer 50, then etching the exposed surface of dielectric layer 50), depositing a metal or conductor therein, and removing the metal or conductor from regions outside the contact hole. Contact 62 and interconnect metal 64 may be formed as a unitary structure by (i) conventional blanket deposition of a metal or conductor onto dielectric layer 50 having contact holes therein, then conventional photolithography and etching; (ii) printing a conductor ink onto dielectric layer 50 having contact holes therein; or (iii) a "dual damascene" approach (not shown in FIG. 8), in which a trench is etched part of the way through dielectric layer 50 (which preferably has contact holes already formed therein) in a pattern corresponding to interconnect metal 64, then a metal or conductor is blanket deposited (or printed) onto dielectric layer 50, and the metal or conductor in regions outside the contact hole and trench is removed.

Referring back to FIG. 5, after forming conductors 42 and 44, the present method may further comprise the step of passivating the device containing the TFT (e.g., forming a passivation or dielectric layer 50 over the conductive structures 42 and 44, gate metal/semiconductor layers 20/36, and, to the extent they are exposed, portions of source and drain terminals 32 and 34, semiconductor layer 12 and substrate 10). Passivation layer 50 generally inhibits or prevents the ingress of water, oxygen, and/or other species that could cause the degradation or failure of the device, and may add some mechanical support to the device, particularly during further processing. The passivation layer 50 may be formed by conventionally coating the upper surface of the device with one or more inorganic barrier layers such as a polysiloxane; a nitride, oxide and/or oxynitride of silicon and/or aluminum; and/or one or more organic barrier layers such as parylene, a fluorinated organic polymer, or other barrier material.

As shown in FIG. 8, when the device contains two layers of metal, a second dielectric or passivation layer 70 is formed over the device. In this case, the first dielectric layer 50 may be considered an "interlayer dielectric," and the second dielectric layer 70 may be the passivation layer. In this embodiment, the first dielectric layer 50 may comprise a material having lower stress than passivation layer 70. For example, first dielectric layer 50 may comprise an oxide, such as $SiO_2$ (e.g., CVD TEOS), USG, FSG, BPSG, etc., and passivation layer 70 may comprise silicon nitride or a silicon oxynitride. Also, passivation layer 70 may have a thickness slightly greater than that of first dielectric layer 50.

Exemplary MOS Transistors

One aspect of the invention relates to an electronic device, comprising (a) an electrically functional thin film substrate; (b) a dielectric film on portions of the electrically functional substrate; (c) a gate metal layer on the dielectric film; and (d) source and drain terminals comprising a doped semiconductor layer in which a dopant is substantially uniformly distributed throughout substantially the entire thickness of the doped semiconductor layer, each terminal having a border closest to the gate metal layer substantially aligned with a border of the gate metal layer. Typically, the device comprises a MOS TFT, although the technology is applicable to other types of transistors having regions or terminals at different horizontal levels that may benefit from self-alignment. Also, as explained below, the present MOS TFT can be configured to form other kinds of electronic devices.

Generally, the semiconductor material of the gate semiconductor layer and the source and drain terminals comprises (i) a Group IVA element, a III-V compound semiconductor such as GaAs, a II-VI (or chalcogenide compound) semiconductor such as ZnO or ZnS, or an organic or polymeric semiconductor and (ii) a dopant element. Preferably, the semiconductor comprises Si and/or Ge and a dopant selected from the group consisting of B, P, As and Sb. Preferably, the dopant has a concentration profile (e.g., dopant concentration as a function of semiconductor layer thickness) that is substantially uniform throughout substantially the entire thickness of the semiconductor layer. Such semiconductor thin films and methods for making the same are disclosed in copending U.S. patent application Ser. No. 10/949,013, filed on Sep. 24, 2004, the relevant portions of which are incorporated herein by reference. For example, the semiconducting thin film may comprise a substantially uniform layer of doped semiconducting material, the doped semiconducting material comprising (a) a hydrogenated, amorphous or at least partially polycrystalline Group IVA element, the Group IVA element comprising at least one of silicon and germanium, and (b) a dopant. In certain embodiments, the Group IVA element in the thin film comprises or consists essentially of silicon, and the dopant (which may be B, P, As or Sb, but which is preferably B or P) may have a concentration of from about $10^{16}$ to about $10^{21}$ atoms/$cm^3$. Notably, the concentration profile of the dopant in the thin film does not vary significantly throughout the substantial thickness or depth of the film.

FIG. 5 shows a cross-section of a first exemplary electronic device according to the present invention, a TFT made by an exemplary embodiment of the present method. As explained above with respect to the present method, the exemplary electronic device of FIG. 5 comprises electrically inactive substrate 10, semiconductor layer 12 (which may be lightly doped and which may function in part as the TFT channel) thereon, gate dielectric layer 16 on semiconductor layer 12, a gate comprising gate metal layer 20 on gate dielectric layer 16 and gate semiconductor layer 36 on gate metal layer 20, source and drain terminals 32 and 34 on semiconductor layer 12, conductors 42 and 44 on source and drain terminals 32 and 34, and passivation layer 50 over the entire device. As mentioned above, the borders of source and drain terminals 32 and 34 closest to the gate are self-aligned with the outermost border of gate semiconductor layer 36 along the length of gate semiconductor layer 36 (i.e., normal to the plane of the page on which FIG. 5 is shown). In those cases where gate semiconductor layer 36 is removed or consumed, the borders of source/drain terminal films 32 and 34 closest to gate metal layer 20 are still aligned with the closest border of gate metal layer 20, but with a small offset (as explained herein). Generally, the interface between source/drain terminals 32 and 34 and lightly doped semiconductor layer 12 is substantially coplanar with the interface between gate dielectric layer 16 and semiconductor layer 12. Consequently, the present MOS TFT may have a raised or elevated source/drain configuration. In one embodiment, the source and drain terminals consist essentially of heavily doped polysilicon.

In the embodiment of FIG. 5, the gate semiconductor layer 36 has a width greater than the width of the gate metal layer 20 (to the extent gate semiconductor layer 36 is present in the device), and the gate metal layer 20 has a width greater than the width of the gate dielectric layer 16. The width of gate semiconductor layer 36 (or of a metal silicide corresponding to such a layer) is greater than the width of the gate metal layer 20 generally by about two times the thickness of gate semiconductor layer 36. In various embodiments, gate metal 20 has a width of at least 0.1 microns, 0.5 microns, 1 micron, or 2 microns. In one implementation, the minimum gate width is about 5 microns. Gate metal 20 may have a length of from about 1 μm to about 1000 μm or any range of values therein (e.g., from about 2 μm to about 200 μm, or from about 5 μm to about 100 μm, etc.), and a thickness of from about 50 nm to about 10,000 nm or any range of values therein (e.g., from about 100 to about 5000 nm, or from about 200 to about 2000 nm, etc.). The source and drain terminals 32 and 34 (and, to the extent it may be present, the gate semiconductor layer 36) may have a thickness of from 10 to 1000 nm or any range of values therein (e.g., from 100, 200, or 250 Å to 10,000, 1000, or 500 Å). The source and drain terminals 32 and 34 may comprise one or more layers of heavily doped semiconducting material, formed as described above, in which the layers may have the same or different dopants and doping levels.

The present electronic device may further comprise (i) one or more first conductors (e.g., 42 and 44 in FIG. 5) electrically connected to each of the source and drain terminals, and/or (ii) a second conductor (e.g., 46 in FIGS. 6-7 or conductor 64 and via/contact 62 in FIG. 8) electrically connected to the gate. In one typical embodiment, each of the source and drain terminals 32 and 34 and the gate have a unique conductor in electrical contact therewith. The conductors may comprise or consist essentially of one or more layers of the conductive and/or barrier materials described above with regard to the present method. Also, as shown in FIGS. 6 and 8, the conductor 46 in electrical contact with the gate may be in physical contact with a "landing pad" region 38 of the gate. Landing pad 38 generally has a width of at least about 1.25, 1.33 or 1.5 times the width of gate metal 20, up to about 2, 3 or 4 times the width of gate metal 20. Landing pad 38 also may be located some finite and/or predetermined distance away from source and drain terminals 32 and 34.

Alternatively, one or more of the conductors 42, 44 and 46 (and in one implementation, the conductor in electrical communication with the gate) may be in electrical communication with a transistor terminal (e.g., gate metal layer 20 and/or gate semiconductor layer 36) through a conductive contact. FIG. 8 shows a cross-section of an exemplary embodiment of this alternative structure, along the length of the gate. A contact 62 may be formed in dielectric layer 50 by first etching a hole therein at a location over gate landing pad 38, then depositing a conductive material (selected from among those described herein) in the hole. Excess conductive material may then be removed from areas outside the hole by conventional techniques to form contact 62. Conductor 64 is then formed in electrical contact with contact 62 by any of the techniques described herein for forming conductors, and a passivation layer 70 is formed thereover.

Conductors in communication with one of the source/drain terminals or the gate terminal may also be coupled to or continuous with another one of the conductors. For example, in a diode-configured transistor, a conductor may be in electrical communication with one source/drain terminal and the gate. In a capacitor-configured transistor, a conductor may be in electrical communication with both source/drain terminals. Alternatively, a thin dielectric layer may be formed over a source/drain terminal, and a conductor capacitively coupled to the underlying source/drain terminal may be formed thereover.

The gate dielectric film 16 in the present electronic device may comprise any of the materials for the gate dielectric film 16 described above with regard to the present method. The gate dielectric film 16 may have a width and length slightly less than the corresponding dimensions of the gate metal layer 20 when it is wet etched, but the two layers 16 and 20 will have substantially the same width and length when gate dielectric film 16 is dry etched. Gate dielectric film 16 may have a thickness of from 20 Å to 400 Å or any range of values therein (e.g., from 30 to 300 Å, or from 50 to 200 Å, etc.). Alternatively, a thicker gate dielectric layer (e.g., in the range of from 500 to 2000 Å, and in one implementation, on the order of about 1500 Å) could be used, along with higher dielectric constant materials than silicon dioxide or aluminum oxide. In one embodiment, the gate dielectric film 16 has a thickness greater than the thickness of the heavily doped source and drain terminals 32 and 34, largely to minimize the possibility that source and drain terminals 32 and 34 may form an electrical connection to gate metal layer 20. However, for high speed transistors, generally a thin gate dielectric film 16 is preferred.

The electrically functional substrate in the present electronic device may comprise a mechanical support structure, such as a single crystal silicon wafer or metal foil having an insulator layer thereon or an electrically inert or inactive substrate such as a plastic sheet or glass plate, with an electrically active layer thereon. As described above, in one embodiment, the electrically active layer comprises a semiconductor layer 12, which may be lightly doped (e.g., having a dopant concentration of from about $10^{16}$ to about $5\times10^{18}$ atoms/cm$^3$). Similar to the heavily doped semiconductor of the source/drain terminals 32 and 34 and the gate semiconductor layer 36, lightly doped semiconductor layer 12 may have a concentration profile (e.g., dopant concentration as a function of semiconductor layer thickness) that is substantially uniform throughout substantially the entire thickness of the semiconductor layer.

Typical semiconductor layer 12 thicknesses may be from about 50, 75 or 100 nm to about 200, 500 or 1000 nm. The film thickness may be chosen to optimized the electrical properties of the transistor. In preferred embodiments, semiconductor layer 12 comprises or consists essentially of a lightly doped semiconductor material, such as one or more Group IVA elements (e.g., silicon and/or germanium), a so-called "III-V" material (e.g., GaAs), etc., further containing a dopant (such as B, P, As or Sb) in a concentration of from ~$10^{16}$ to ~$5\times10^{18}$ atoms/cm$^3$. Exemplary lightly doped semiconductor films are disclosed in copending U.S. application Ser. No. 10/949,013, filed Sep. 24, 2004, the relevant portions of which are incorporated herein by reference. For example, the semiconducting thin film may comprise a substantially uniform layer of doped semiconducting material, the doped semiconducting material comprising (a) a hydrogenated, amorphous or at least partially polycrystalline Group IVA element, the Group IVA element, comprising at least one of silicon and germanium, and (b) a dopant. In certain embodiments, the Group IVA element in the thin film comprises or consists essentially of silicon, and the dopant (which may be B, P, As or Sb, but which is preferably B or P) may have a concentration of from about $10^{16}$ to about $10^{21}$ atoms/cm$^3$. Notably, the concentration profile of the dopant into the thin film does not vary significantly throughout the substantial thickness or depth of the film.

Suitable electrically inert or inactive substrates may comprise a plate, disc, and/or sheet of a glass, ceramic, dielectric and/or plastic. Alternatively, suitable electrically conductive substrates may comprise a wafer, disc, sheet and/or foil of a semiconductor (e.g. silicon) and/or a metal. However, any such electrically conductive substrate should have an insulator layer between it and any electrically active layer or structure thereover (e.g., semiconductor layer 12). Preferably, the substrate comprises a member selected from the group consisting of a silicon wafer, a glass plate, a ceramic plate or disc, a plastic sheet or disc, metal foil, a metal sheet or disc, and laminated or layered combinations thereof (such as electrically inactive substrate 10 having lightly doped semiconductor layer 12 thereon), the electrically conductive members of which generally have an insulator layer (e.g., a layer of the corresponding oxide) thereon.

CONCLUSION/SUMMARY

Thus, the present invention provides an electronic device (such as a MOS transistor) having self-aligned source and drain terminals, and a method for its manufacture. The device generally comprises (a) an electrically functional (e.g., thin film) substrate; (b) a dielectric film on portions of the electrically functional substrate, (c) a gate metal layer on the dielectric film; and (d) source and drain terminals comprising a substantially uniformly doped semiconductor layer, self-aligned with the gate semiconductor layer (so-called "self-aligned" source/drain terminals). The method generally comprises the steps of (1) forming an amorphous semiconductor material on a gate and exposed portions of an electrically functional substrate; (2) irradiating an upper surface of the amorphous semiconductor material to form polycrystalline, self-aligned semiconducting source/drain terminal layers, and remaining amorphous semiconductor material portions; and optionally (3) selectively removing the remaining amorphous semiconductor material portions from a gate sidewall (e.g., to physically and/or electrically isolate the self-aligned source and drain terminals).

The present invention advantageously provides a low cost method for making MOS TFTs having reliable, commercially acceptable electrical characteristics (e.g., on/off speeds and ratios, carrier mobilities, $V_t$'s, etc.). Printed and/or radiation-defined semiconductor structures (and, optionally, printed and/or radiation-defined conductor structures) may provide results similar to structures formed by more conventional approaches at a much lower cost and at a much higher throughput (on the order of hours to days, as opposed to weeks to months using conventional MOS semiconductor process technology). One or more optional wet etches of dielectric materials may provide increased throughput and/or etch selectivity, relative to dry etching.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electronic device, comprising:
   a substrate having an electrically inert surface;
   a lightly doped semiconductor layer on the electrically inert surface;
   a dielectric film on portions of said lightly doped semiconductor layer;
   a gate metal layer on said dielectric film, the gate metal layer having a peripheral border; and
   source and drain terminals comprising a heavily doped semiconductor layer on a surface of said lightly doped semiconductor layer not covered by said dielectric film and opposite to an interface of said lightly doped semiconductor layer with said electrically inert surface, wherein region(s) of said heavily doped semiconductor layer are in an amorphous state and said heavily doped semiconductor layer contains a substantially uniformly distributed dopant throughout substantially the entire thickness of the region(s) of said heavily doped semiconductor layer in an amorphous state, each of said source and drain terminals having a border (i) closest to said gate metal layer and (ii) defined by the thickness of the heavily doped semiconductor layer, that is substantially aligned with a closest portion of the peripheral border of said gate metal layer.

2. The electronic device of claim 1, wherein said heavily doped semiconductor layer of said source and drain terminals has a thickness of from 10 to 400 nm.

3. The electronic device of claim 1, further comprising (i) one or more first conductors electrically connected to each of said source and drain terminals and (ii) a second conductor electrically connected to said gate metal layer.

4. The electronic device of claim 1, wherein said substrate comprises an electrically inert substrate and an electrically active layer thereon comprising said lightly doped semiconductor layer.

5. The electronic device of claim 1, wherein said heavily doped semiconductor layer comprises an electrically active, polycrystalline semiconductor layer.

6. The electronic device of claim 1, wherein said heavily doped semiconductor layer comprises Si or Ge, and the dopant is selected from the group consisting of B, P, As and Sb.

7. The electronic device of claim 6, wherein said heavily doped semiconductor layer comprises Si, and the dopant is selected from the group consisting of B and P.

8. The electronic device of claim 1, wherein said source and drain terminals and said lightly doped semiconductor have an interface therebetween that is substantially coplanar with an interface between said gate dielectric layer and said lightly doped semiconductor layer.

9. The electronic device of claim 1, wherein said source and drain terminals consist essentially of heavily doped polysilicon.

10. The electronic device of claim 1, further comprising a gate semiconductor layer or a metal silicide on the gate metal layer having a width greater than a width of the gate metal layer by about two times a thickness of the gate semiconductor layer or the metal silicide.

11. The electronic device of claim 1, wherein the border of each of said source and drain terminals closest to the gate metal layer border is offset from the gate metal layer by about a thickness of the heavily doped semiconductor layer.

12. The electronic device of claim 1, wherein the gate metal layer has a width of at least 1 micron.

13. The electronic device of claim 12, wherein the gate metal layer has a minimum width of about 5 microns.

14. The electronic device of claim 1, wherein the source and drain terminals have a thickness of from 10 to 1000 nm.

15. The electronic device of claim 1, wherein the gate dielectric film has a thickness of from 20 to 400 Å.

16. The electronic device of claim 1, wherein the gate dielectric film has a thickness of from 500 to 2000 Å and comprises a material having a higher dielectric constant than silicon dioxide.

17. The electronic device of claim 1, wherein the gate dielectric film has a thickness greater than a thickness of the heavily doped semiconductor layer.

18. The electronic device of claim 1, wherein the electrically functional substrate comprises a metal foil having an insulator layer thereon.

19. The electronic device of claim 1, wherein said lightly doped semiconductor has a dopant concentration of from about $10^{16}$ to about $5 \times 10^{18}$ atoms/cm$^3$.

20. The electronic device of claim 1, wherein said lightly doped semiconductor has a thickness of from 50 nm to about 1000 nm.

21. The electronic device of claim 20, wherein said lightly doped semiconductor has a thickness of from 50 nm to about 200 nm.

22. The electronic device of claim 1, wherein said heavily doped semiconductor layer further comprises semiconductor material on sidewalls of said gate metal layer in said amorphous state.

23. The electronic device of claim 1, wherein the border of each of said source and drain terminals closest to said gate metal layer and defined by the thickness of the heavily doped semiconductor layer is offset from the gate metal layer by a maximum of about the thickness of the heavily doped semiconductor layer.

* * * * *